(12) United States Patent
Yelluru

(10) Patent No.: US 7,277,307 B1
(45) Date of Patent: Oct. 2, 2007

(54) COLUMN DEFECT DETECTION IN A CONTENT ADDRESSABLE MEMORY

(75) Inventor: Sadashiva Rao Yelluru, Santa Clara, CA (US)

(73) Assignee: NetLogic Microsystems, Inc., Mt. View, CA (US)

( * ) Notice: Subject to any disclaimer, the term of this patent is extended or adjusted under 35 U.S.C. 154(b) by 196 days.

(21) Appl. No.: 11/240,160

(22) Filed: Sep. 30, 2005

(51) Int. Cl.
*G11C 15/00* (2006.01)
*G11C 7/00* (2006.01)

(52) U.S. Cl. .................... 365/49; 365/189.07; 365/207

(58) Field of Classification Search .................. 365/49, 365/189.07, 201
See application file for complete search history.

(56) References Cited

U.S. PATENT DOCUMENTS

| | | | | |
|---|---|---|---|---|
| 5,802,070 A | * | 9/1998 | Adams et al. ................. | 365/49 |
| 6,430,072 B1 | * | 8/2002 | Chadwick et al. ............ | 365/49 |
| 6,707,718 B1 | * | 3/2004 | Halim et al. .................. | 365/49 |
| 6,714,466 B2 | * | 3/2004 | Park et al. .................... | 365/201 |
| 6,865,098 B1 | * | 3/2005 | Ichiriu et al. ................. | 365/49 |
| 7,130,230 B2 | * | 10/2006 | Jain et al. ..................... | 365/201 |
| 7,171,595 B1 | * | 1/2007 | Huse et al. .................... | 365/49 |

* cited by examiner

*Primary Examiner*—Trong Phan
(74) *Attorney, Agent, or Firm*—William L. Paradice, III

(57) ABSTRACT

A content addressable memory (CAM) device. For one embodiment, the CAM device includes a CAM array having a plurality of columns of CAM cells, a plurality of storage elements, each for storing a column pass/fail signal indicating whether a corresponding column of CAM cells is designated as good or as bad, and a test circuit having an output coupled to the storage elements, and configured to generate the column pass/fail signals during a column test sequence.

24 Claims, 8 Drawing Sheets

US 7,277,307 B1

COLUMN DEFECT DETECTION IN A CONTENT ADDRESSABLE MEMORY

FIELD OF INVENTION

The present invention relates generally to integrated circuits, and more specifically reducing the time required to test integrated circuits for defects.

DESCRIPTION OF RELATED ART

A content addressable memory (CAM) device is a storage device having an array of memory cells that can be instructed to compare the specific pattern of a search key (also referred to as comparand data or a comparand word) with data words stored in rows of the array. The entire CAM array, or segments thereof, may be searched in parallel for a match with the comparand data. If a match exists, the CAM device indicates the match condition by asserting a match flag, and may indicate the existence of multiple matches by asserting a multiple match flag. The CAM device typically includes a priority encoder that determines the highest priority matching address (e.g., the lowest matching CAM index). The highest priority matching address (HPM), the contents of the matched location, and other status information (e.g., skip bit, empty bit, full flag, as well as match and multiple match flags) may be output from the CAM device to an output bus. In addition, associative data may be read out from an associated addressable storage device (e.g., DRAM).

Row and/or column redundancy techniques have been used to improve the yield of CAM devices. For example, some CAM devices include a number of spare rows and/or a number of spare columns that may be used to replace defective rows and/or columns, respectively, of CAM cells in a CAM array. As known in the art, the defective rows and columns may be replaced by spare rows and spare columns, respectively, by blowing one or more fuses associated with each defective row or column to disable the defective row or column and by blowing one or more fuses associated with each corresponding spare row or column to enable the spare row or column.

Physical defects, such as stuck-at high (SA-1) faults and stuck-at low (SA-0) faults, in a CAM array are typically detected at wafer sort. For example, each wafer (which typically includes a plurality of identical CAM devices formed thereon) is physically placed in and electrically connected to a test machine via a probe card or other suitable communication interface. During the first pass, the test machine tests the CAM array in a well-known manner to determine whether any columns in the CAM array have defects, and generates corresponding column test results. The wafer is then removed from the test machine and taken to a repair station. In response to the column test information, the repair station is used to replace the defective columns with corresponding spare columns, for example, by blowing fuses associated with the defective columns and corresponding spare columns. Then, the wafer is removed from the repair station, taken back to the test machine, and re-connected to the test machine. Then, during the second pass, the test machine tests the CAM array in a well-known manner to determine whether any rows in the CAM array have defects, and generates corresponding row test results. In response to the row test information, the repair station is used to replace the defective rows with corresponding spare rows, for example, by blowing fuses associated with the defective rows and corresponding spare rows. Then, the wafer is removed from the repair station, and typically tested again to ensure that any defective rows and/or columns have been properly replaced by corresponding spare rows and/or columns, respectively. Thereafter, the wafer may be cut (e.g., diced) into separate circuit dice, which are then individually packaged using well-known packaging techniques.

In the sequence described above, defective columns are replaced by corresponding spare columns prior to the row test sequences so that column defects do not manifest themselves as row defects during compare operations associated with the row test sequences. However, the sequence described above is time consuming as it requires two separate insertions and removals from the test equipment, thereby increasing the test costs and ultimately the device costs for the manufacturer.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Figure 1:
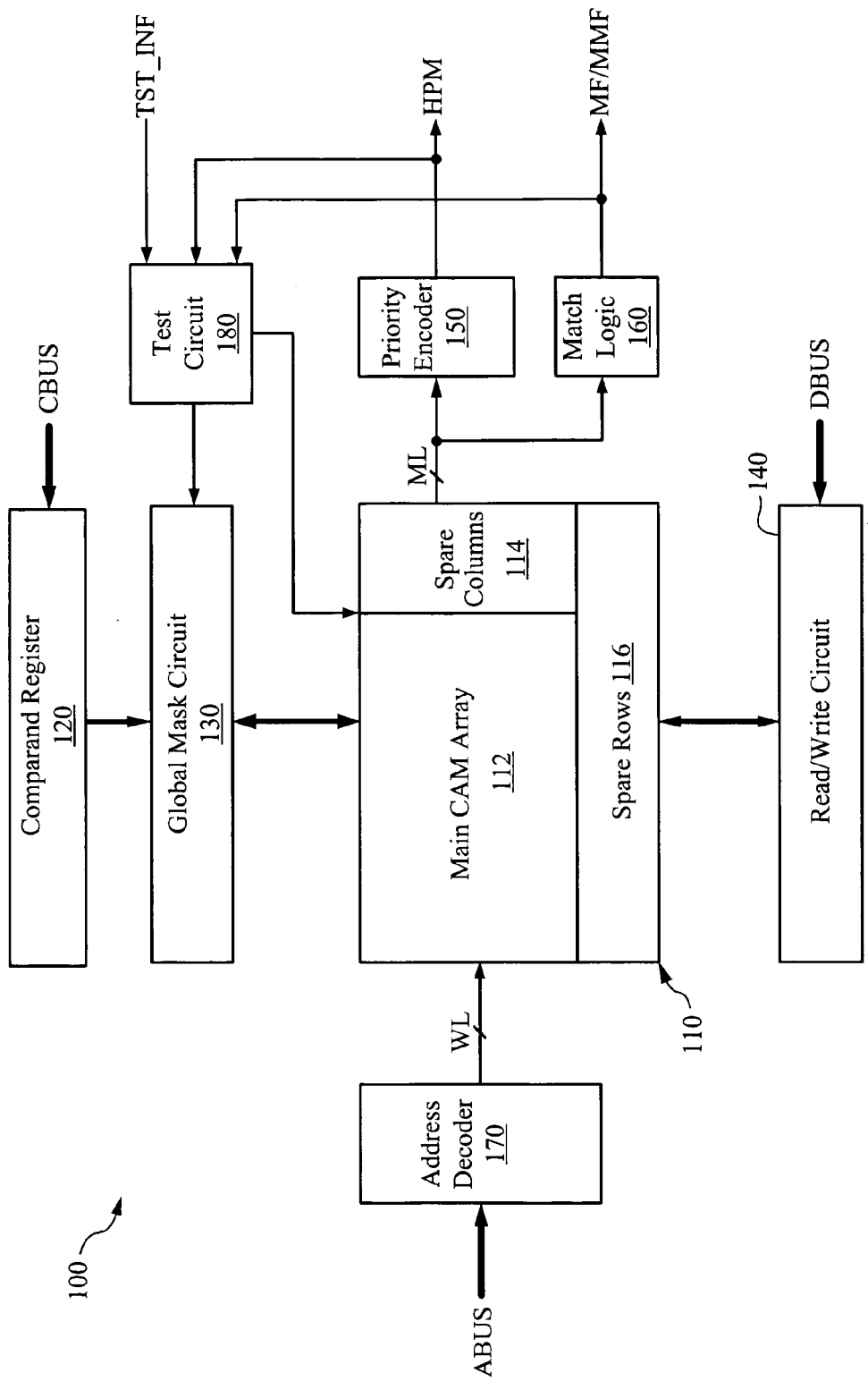
FIG. 1 is a block diagram of a CAM device in accordance with some embodiments of the present invention.

A method and apparatus for detecting physical defects in a memory array are described below with respect to an exemplary CAM device for simplicity only. Indeed, embodiments of the present invention are equally applicable for testing other CAM architectures. In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be buses. Additionally, logic states of various signals described herein are exemplary and therefore may be reversed or otherwise modified as generally known in the art.

Embodiments of the present invention may reduce the time required for detecting physical faults in a CAM array by dynamically disabling the defective columns of the CAM array in response to column test sequences while the device remains connected to an external test machine so that subsequent row test sequences in which the defective columns do not participate may be initiated without disconnecting the device from the test machine. For some embodiments, a wafer containing any number of CAM devices (each of which may include any number of CAM arrays) is positioned within and electrically connected to a test machine. The test machine is used to provide any number of test patterns to test each CAM array to determine whether any columns in the CAM array have defects, and generates corresponding column test results. While the wafer remains connected to the test machine, the defective columns of the CAM array are dynamically disabled. With the defective columns prevented from participating in subsequent test compare operations, the test machine is used to test the CAM array to determine whether any rows in the CAM array have defects, and generates corresponding row test results. The wafer is then removed from the test machine and taken to a repair station. Using the column and row test results, the repair station is employed to replace the defective columns with corresponding spare columns, and/or to replace the defective rows with corresponding spare rows. Thereafter, the wafer may be cut to separate the dice from each other, and then each die may be packaged using well-known packaging techniques. For other embodiments, the CAM device includes built-in self-test logic and circuitry that generates one or more of the test patterns for detecting the column and/or row defects. The built-in self-test logic may initiate its test patterns in response to instructions or one or more control signals generated by the test machine or from another external stimulus. The built-in self-test logic and circuitry may be used for any of the embodiments described below that describe test patterns generated, initiated or detected using an external test machine.

FIG. 1 shows one embodiment of a CAM device 100 in accordance with the present invention. CAM device 100 includes a CAM array 110, a comparand register 120, a global mask circuit 130, a read/write circuit 140, a priority encoder circuit 150, match logic 160, an address decoder 170, and a test circuit 180. CAM array 110, which may include any number of CAM cells (not shown in FIG. 1), includes a main CAM array 112, one or more spare CAM columns 114, and one or more spare CAM rows 116. The spare CAM columns 114 are independent columns of CAM cells that may be enabled to functionally replace columns of CAM cells in main CAM array 112 that have one or more defective CAM cells. The spare CAM rows 116 are independent rows of CAM cells that may be enabled to functionally replace rows of CAM cells in main CAM array 112 that have one or more defective CAM cells. While main CAM array 112 is shows as a single CAM array, it may alternatively be comprised of any number of CAM array blocks each having their own spare columns and/or spare rows, or sharing one or more spare columns and/or spare rows with another CAM array block.

One or more instructions and related control signals may be provided to CAM device 100 from an instruction decoder (not shown for simplicity) to control read, write, compare, initialization, test, and other operations for CAM device 100. Other well-known signals which can be provided to CAM device 100, such as enable signals, clock signals, and power connections, are not shown for simplicity. Further, although not shown in FIG. 1, each row of CAM cells in main CAM array 112 and each spare row 116 can have one or more validity bits to indicate whether the corresponding row (or any segment thereof of CAM cells stores valid data. In addition, for some embodiments, the rows in main CAM array 112 and spare rows 116 can be divided into a plurality of row segments, for example, to reduce the capacitive loading for each row or to provide multiple width/depth configurations for the array.

Each row of CAM cells in array 110 is coupled to address decoder 170 via a corresponding word line WL, and to a priority encoder 150 and to match logic 160 via a corresponding match line ML. For one embodiment, address decoder 170 receives addresses from an address bus ABUS. For other embodiments, address decoder 170 receives addresses from another bus. Address decoder 170 may include well-known circuitry that steers data from defective (e.g., and disabled) rows to corresponding spare rows 116, for example, as described in commonly owned U.S. Pat. Nos. 6,714,430 and 6,804,135, the entireties of which are incorporated by reference herein. For simplicity, the word lines and match lines are represented collectively in FIG. 1.

The match lines ML provide match results for compare operations between comparand data (e.g., a search key) and data stored in CAM array 110 to priority encoder 150. In response thereto, priority encoder 150 determines the matching entry that has the highest priority number associated with it and generates the index or address of this highest priority match (HPM). In addition, priority encoder 150 may use the validity bits from CAM array 110 to generate the next free address (NFA) that is available in CAM array 110 for storing new data. Although not shown in FIG. 1, for some embodiments, priority encoder 150 may provide the NFA to address decoder 170. For some embodiments, priority encoder 150 may be of the type described in commonly owned U.S. Pat. No. 6,275,426, the entirety of which is incorporated herein by reference.

Match logic 160 is well-known, and uses the match results from CAM array 110 to generate a match flag MF indicative of a match condition, and can generate a multiple match flag MMF to indicate multiple matches. In addition, match logic 160 may use the validity bits from CAM array 110 to assert a full flag (not shown for simplicity) when all of the rows of CAM cells in CAM array 110 are filled with valid entries.

Each column of CAM cells in main array 112 and each spare column 114 is coupled to read/write circuit 140 and to global mask circuit 130. Global mask circuit 130, which is coupled to CAM array 110 and to comparand register 120, may store any number of block masks (e.g., masking patterns) that mask entries in CAM array 110 during compare operations between the comparand word and data stored in CAM array 110. For some embodiments, comparand words may be provided to global mask circuit 130 from comparand register 120 via a comparand bus CBUS. Read/write circuit 140, which includes well-known write drivers and sense amplifiers to write data to and read data from CAM array 110, is also coupled to a data bus DBUS.

Comparand register 120 and read/write circuit 140 may include or be coupled to well-known steering logic (not shown for simplicity) that steers data to and from selected columns of CAM array 110 in response to one or more control signals that indicate which columns (if any) in main CAM array 112 are defective and have been replaced by spare columns 114. For some embodiments, the steering logic may be of the type disclosed in commonly owned U.S. Pat. Nos. 6,714,430 and 6,804,135, the entireties of which are incorporated by reference herein.

Spare columns 114 may be programmed to replace defective columns of CAM cells in main CAM array 112 in any suitable manner. For some embodiments, the defective columns may be replaced by spare columns in a well-known manner using fuses, for example, where blowing a fuse or fuses associated with a defective column disables the defective column and blowing a fuse or fuses associated with a spare column enables the spare column. For other embodiments, the defective columns may be replaced by spare columns without using fuses, for example, as described in commonly owned U.S. Pat. Nos. 6,714,430 and 6,804,135. Similarly, spare rows 116 may be programmed to replace defective rows of CAM cells in main CAM array 112 in any suitable manner. For some embodiments, the defective rows may be replaced by spare rows in a well-known manner using fuses, for example, where blowing a fuse or fuses associated with a defective row disables the defective row and blowing a fuse or fuses associated with a spare row enables the spare row. For other embodiments, the defective rows may be replaced by spare rows without using fuses, for example, as described in commonly owned U.S. Pat. Nos. 6,249,467 and 6,445,628, the entireties of which are incorporated by reference herein.

Test circuit 180 is shown in the exemplary embodiment of FIG. 1 as including a first input to receive the HPM from priority encoder 150, a second input to receive match information MF/MMF from match logic 160, a third input to receive test information TST_INF, and outputs coupled to global mask circuit 130 and to CAM array 110. TST_INF carries expected match results (e.g., an expected HPM results and/or an expected MF result) provided by, for example, an external test machine or built-in self-test logic and circuitry. The external test machine and/or built-in self-test logic and circuitry may be any well-known test machine or logic that can generate a sequence of test vectors (which may include test data, test comparand words, and/or test mask patterns) designed to detect and localize physical defects (such as SA-1 and/or SA-0 faults) in CAM array 110. The external test machine may be electrically connected to CAM device 100 prior to dicing and packaging operations in any suitable manner (e.g., using a probe card). During test operations, a test comparand word is provided to comparand register 120 and/or a corresponding mask pattern is provided to global mask circuit 130, and then causes CAM device 100 to compare the test comparand word with the test data to generate test match results. The actual match results generated in response to the compare operation(s) may then be compared with expected match results on TST_INF to determine whether a particular row or column in the CAM array has a fault.

For some embodiments, test circuit 180 includes circuitry configured to compare the expected match results with actual match results generated during test operations to determine the existence of physical defects in the CAM array. For other embodiments, the external test machine may be used to compare the expected match results with the actual match results to determine the existence of physical defects.

Figure 2A:
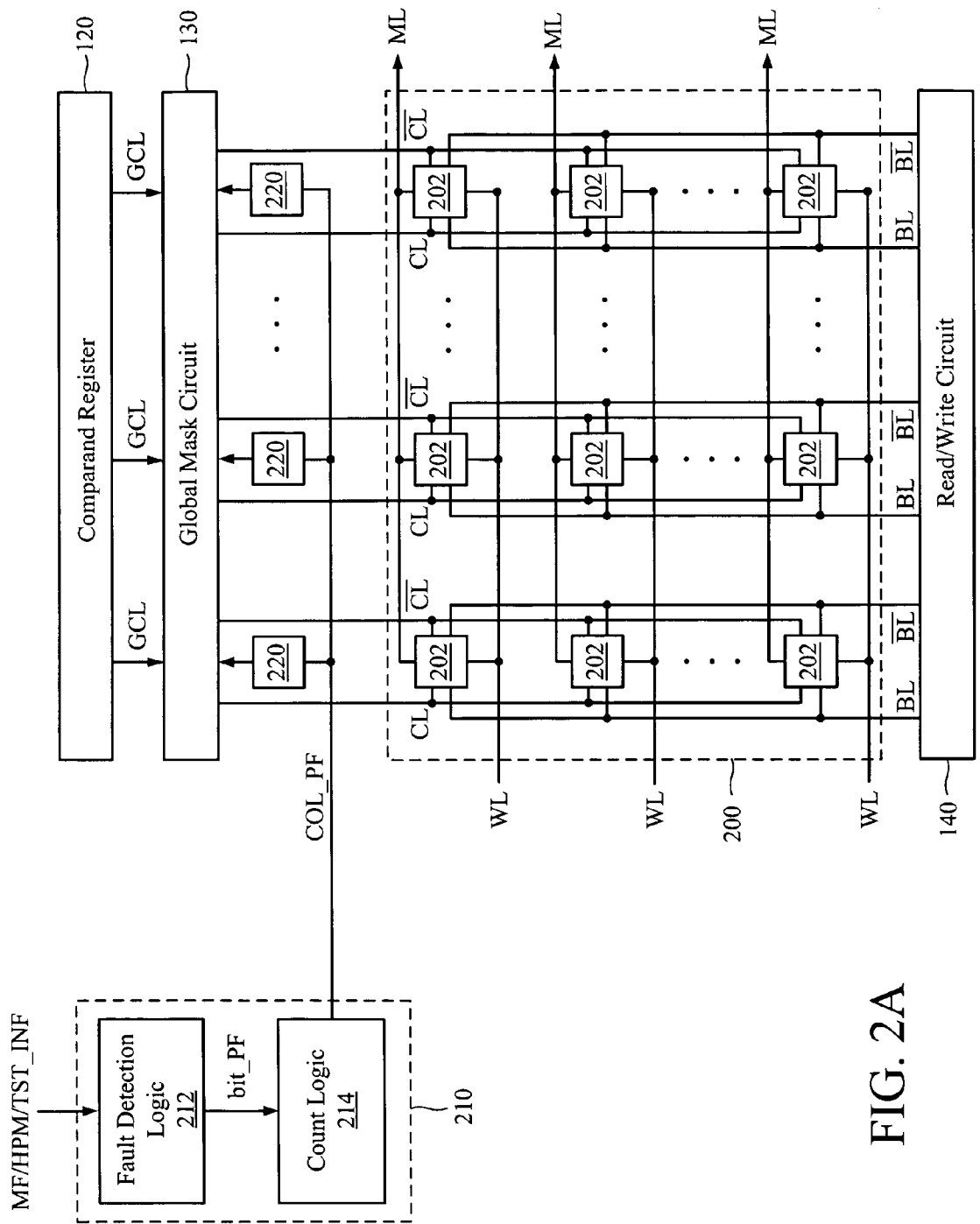
FIG. 2A is a simplified block diagram of one embodiment of the test circuit of FIG. 1 and its connections to the CAM array and global mask circuit of FIG. 1.

FIG. 2A shows a portion of CAM device 100 including a CAM array 200 and a test circuit 210. CAM array 200, which is one embodiment of CAM array 110 of FIG. 1, includes a plurality of CAM cells 202 organized in any number of rows and columns. For simplicity, spare columns of CAM cells and spare rows of CAM cells are not individually shown in FIG. 2A. CAM cells 202 are well-known, and may be any suitable binary, ternary, or quaternary CAM cell, and may utilize any SRAM-based, DRAM-based, or non-volatile memory cell.

Each row of CAM cells 202 is coupled to a match line ML and to a word line WL. Each word line WL is driven by address decoder 170 (see also FIG. 1) to select one or more rows of CAM cells 202 for writing or reading. Each match line ML provides the match results of a compare operation to priority encoder 150 of FIG. 1. A match line ML indicates a match condition for the row only if all CAM cells 202 that participate in a compare operation in that row match the comparand data. In some embodiments, the match line ML is pre-charged for the compare operation. If any CAM cell 202 participating in a compare operation in the row does not match the comparand data, the CAM cell(s) 202 discharges the match line ML toward ground potential (i.e., logic low). Conversely, if all CAM cells 202 that participate in the compare operation match the comparand data, the match line ML remains in a charged (i.e., logic high) state. As noted above, each row of CAM array 200 may include one or more validity bits (not shown for simplicity).

Each column of CAM cells 202 is coupled to a bit line pair BL/$\overline{BL}$ and to a comparand line pair CL/$\overline{CL}$. The bit line pairs BL/$\overline{BL}$ are each coupled to read/write circuit 140. Read/write circuit 140 is well-known, and may include write drivers or buffers to provide data to bit line pairs BL/$\overline{BL}$ during write operations, and may include sense amplifiers to determine the logic states of bit line pairs BL/$\overline{BL}$ during read operations. The comparand line pairs CL/$\overline{CL}$ are each coupled to global mask circuit 130, which in turn is coupled to comparand register 120 via corresponding global comparand lines GCL. For other embodiments, each global comparand line GCL may be a pair of complementary global comparand lines.

Each column in CAM array 200 also includes a status latch 220 that includes inputs coupled to test circuit 210 and an output coupled to global mask circuit 130. Latches 220 may be any suitable storage element including, for example, a register, an SRAM cell, a DRAM cell, and the like. As explained in more detail below, each status latch 220 may be used (e.g., during test operations) to store data indicating whether the corresponding column is designated as a bad column or as a good column. As used herein, a column is designated as a bad column if the column includes more than a predetermined number of defects, and is otherwise designated as a good column. For some embodiments, the predetermined number corresponds to an available number of spare rows in CAM array 110.

Figure 2B:
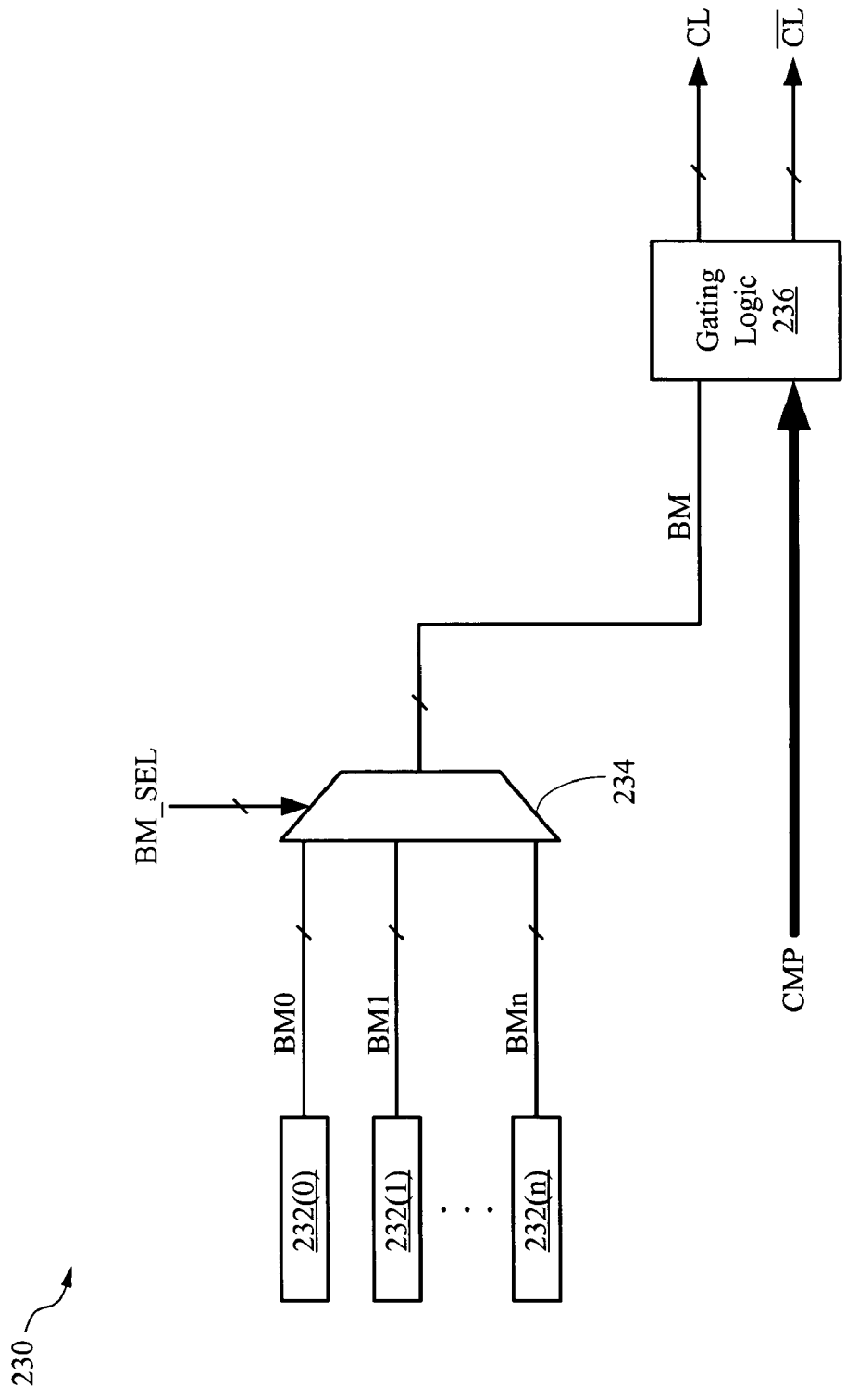
FIG. 2B is a block diagram of a global mask circuit that is an exemplary embodiment of the global mask circuit of FIG. 2A.

Global mask circuit 130 includes a plurality of block mask registers (not shown in FIG. 2A for simplicity) each for storing a corresponding block mask that may be used to selectively mask columns of array 200 during compare operations. For example, FIG. 2B shows a global mask circuit 230 that is an exemplary embodiment of global mask circuit 130. Mask circuit 230 includes a plurality of mask registers 232(0)-232($n$), a multiplexer (MUX) 234, and gating logic 236. Each of mask registers 232(0)-232($n$) stores a corresponding block mask BM0-BMn and includes an output coupled to a corresponding input of MUX 234, which includes an output coupled to a first input of gating logic 236 and a control terminal to receive a block mask select signal BM_SEL. Gating logic 236, which may include well-known circuitry, includes a second input to receive a comparand word CMP (e.g., from comparand register 120), and includes outputs coupled to each comparand line pair CL/$\overline{CL}$ of CAM array 200. For simplicity, the comparand line pairs CL/$\overline{CL}$ are represented collectively in FIG. 2B.

During compare operations between CMP and data stored in CAM array 200, BM_SEL selects one of block masks BM0-BMn to be provided to gating logic 236 via MUX 234. Gating logic 236 logically combines the selected block mask BM with CMP to generate a masked search key that may be driven onto comparand line pairs CL/$\overline{CL}$ for comparison with data stored in CAM cells 202. For some embodiments, the unmasked bits of the search key are driven onto corresponding comparand line pairs CL/$\overline{CL}$ to allow for comparison with data bits stored in corresponding columns of the CAM array, while the masked bits of the search key drive corresponding comparand line pairs CL/$\overline{CL}$ to the same predetermined logic state (e.g., logic low) to effectively preclude participation of corresponding columns of the CAM array during the compare operations. For one embodiment, a logic low mask bit drives the corresponding comparand line pair CL/$\overline{CL}$ to the same logic state to disable the column during the compare operation, and a logic high mask bit allows the comparand bit to be driven onto the corresponding comparand line pair CL/$\overline{CL}$ to enable the column for the compare operation.

For alternate embodiments, other CAM array architectures may be used. For example, in some embodiments, CAM array 200 may not include complementary comparand lines CL/$\overline{CL}$, in which case the complementary bit lines BL/$\overline{BL}$ may be coupled to comparand register 120 via global mask circuit 130 and be used to perform a compare operation as is generally known in the art. Additionally, although CAM array 200 is shown as a NOR-based CAM array, for alternative embodiments, other CAM arrays (e.g., NAND-based CAM arrays) may be used.

With reference again to FIG. 2A, test circuit 210, which is one embodiment of test circuit 180 of FIG. 1, includes fault detection logic 212 and count logic 214. Fault detection logic 212 includes an input to receive match information such as MF from match logic 160, the HPM index from priority encoder 150, and test information TST_INF, and includes an output to provide a bit pass/fail signal bit_PF to count logic 214. For some embodiments, fault detection logic 212 may be configured to compare expected match results with actual match results generated during test compare operations to generate a value for bit_PF that indicates whether a particular CAM cell in the CAM array contains a physical defect (e.g., such as a SA-1 and/or SA-0 fault).

For each test compare operation, fault detection logic 212 may utilize a well-known comparator to generate bit_PF in response to a comparison between the expected match results on TST_INF with the actual match results (e.g., by comparing an expected HPM with the actual HPM and/or comparing the expected MF with the actual MF). For some embodiments, detection logic 212 asserts bit_PF (e.g., to logic high) each time a defect is detected in the CAM array, and maintains bit_PF in a de-asserted state (e.g., logic low) if a defect is not detected.

For other embodiments, the external test machine may be used to compare the expected match results with the generate match results to determine the existence of faults in CAM array 110. For still other embodiments, fault detection logic 212 may include circuitry to implement the functions performed by the external test machine.

Count logic 214 includes an input to receive bit_PF, and includes an output coupled to first inputs of status latches 220 in CAM array 200. For some embodiments, count logic 214 is configured to count the number of defects detected in a selected column of array 200 during column test sequences, and if the number of detected defects is equal to (or greater than) a predetermined number, count logic 214 asserts a column pass/fail signal COL_PF (e.g., to logic high) to designate the selected column as a bad column. Otherwise, if the number of detected defects is less than (or equal to) the predetermined number, count logic 214 de-asserts COL_PF (e.g., to logic low) to designate the selected column as a good column. The COL_PF signal for the selected column may be stored in the column's associated status latch 220, and thereafter used to dynamically disable the bad columns during row test sequences, and in some embodiments, without removing device 100 from the external test machine, as explained below.

An individual status latch 220 may be selectively loaded with COL_PF in response to corresponding select signals generated by global mask circuit 130. Alternatively, separate select logic may be incorporated into the CAM device that selectively enables each status latch during a test sequence for the corresponding column.

Figure 2C:
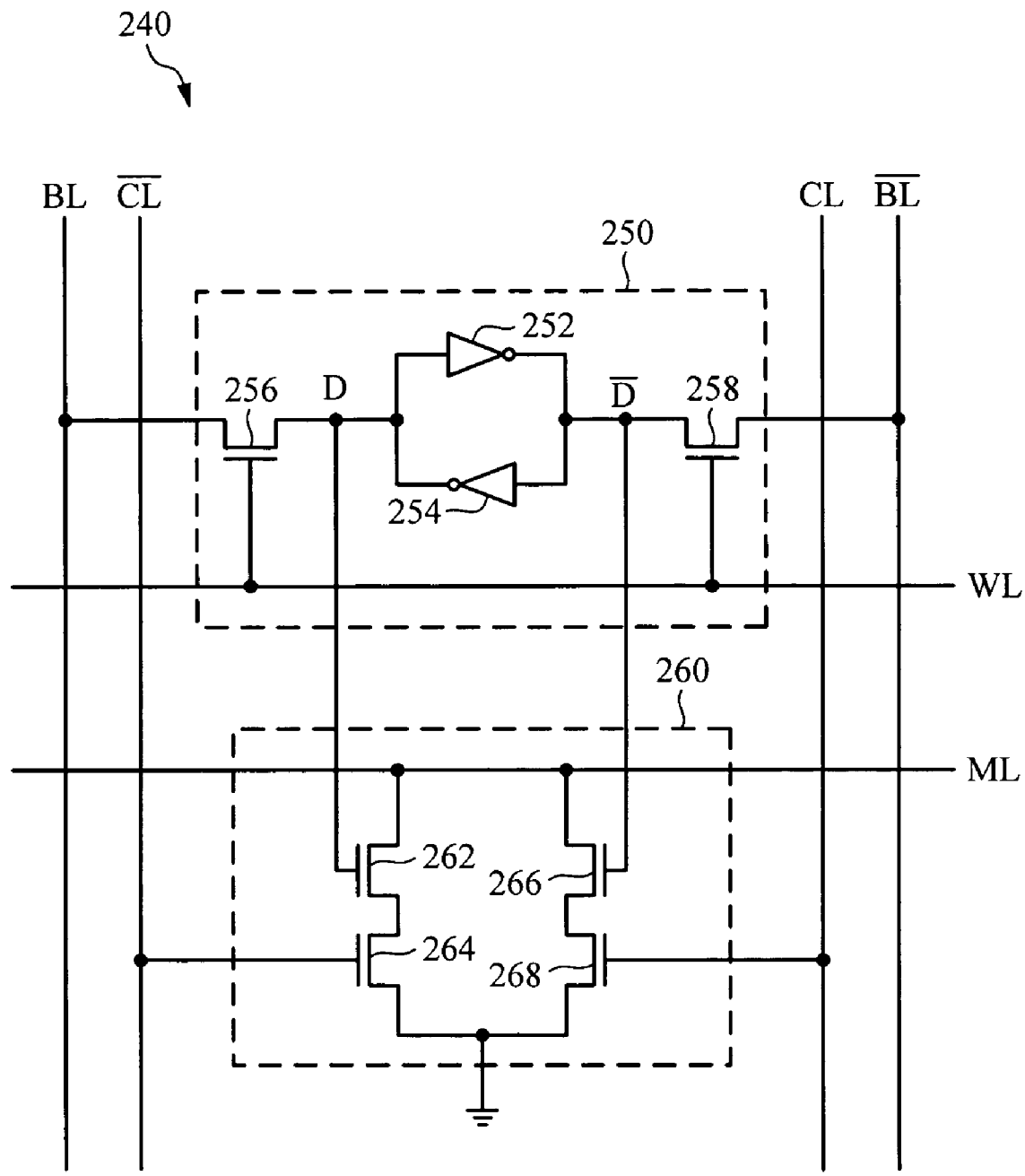
FIG. 2C is a block diagram of one embodiment of the CAM cells of FIG. 2A.

As mentioned above, CAM cells 202 may be any suitable CAM cell. For example, FIG. 2C shows a binary CAM cell 240 that is one embodiment of CAM cell 202 of FIG. 2A. CAM cell 240 includes a memory cell 250 for storing a data bit D and a compare circuit 260 for comparing the data bit with a comparand bit C. Memory cell 250 includes a RAM cell formed by cross-coupled inverters 252 and 254, and includes pass transistors 256 and 258. Pass transistor 256 is coupled between the RAM cell and bit line BL, and has a gate coupled to word line WL. Pass transistor 258 is coupled between the RAM cell and complementary bit line $\overline{BL}$, and has a gate coupled to word line WL.

Compare circuit 260 includes transistors 262, 264, 266, and 268. Transistors 262 and 264 are coupled in series between match line ML and ground potential, with the gate of transistor 262 coupled to memory cell 510 to receive the data bit D and the gate of transistor 264 coupled to complementary comparand line $\overline{CL}$ to receive the complement $\overline{C}$ of the comparand bit. Transistors 266 and 268 are coupled in series between match line ML and ground potential, with the gate of transistor 266 coupled to memory cell 510 to receive the complement $\overline{D}$ of the data bit and the gate of transistor 268 coupled to comparand line CL to receive the comparand bit C. For other embodiments, other well-known compare circuits may be used for compare circuit 260.

For the embodiment shown in FIG. 2C, CAM cell 240 discharges ML to logic low if there is not a match, and does not discharge ML if there is a match. Thus, a logic high signal on match line ML indicates a match for the row, and a logic low signal on match line ML indicates a mismatch for the row. For other embodiments, CL and $\overline{CL}$ may be reversed (e.g., the gate of transistor 264 is coupled to CL and the gate of transistor 268 is coupled to $\overline{CL}$) such that the CAM cell discharges ML to logic low if there is a match and does not discharge ML if there is not a match.

Figure 3A:
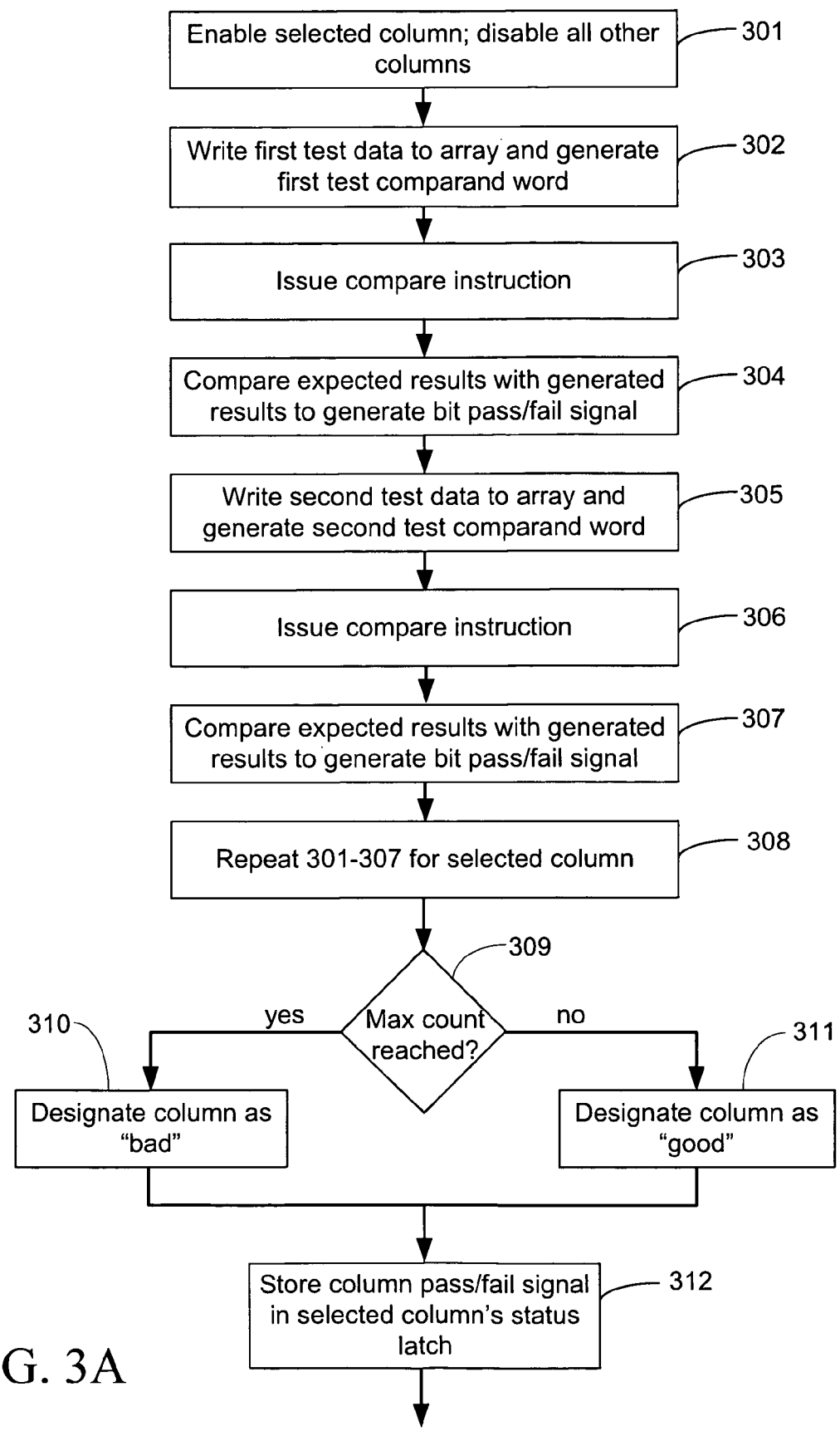
FIGS. 3A-3B show an illustrative flow chart depicting a simplified testing operation in accordance with some embodiments of the present invention.

An exemplary operation of one embodiment of the present invention for detecting defects in an array of CAM cells such as CAM cells 240 is described below with respect to the illustrative flow chart of FIGS. 3A-3B. Prior to dicing, a wafer containing device 100 (as well as a plurality of other devices such as identical copies of device 100) is positioned within and electrically connected to the external test machine in a well-known manner. Then, the external test machine (or built-in self-test logic and circuitry) initiates a series of column test sequences designed to detect defects (e.g., SA-0 and/or SA-1 faults) in the CAM cells in the columns of the CAM array. More specifically, a selected column (e.g., the first column) of the CAM array 200 is enabled for the column test sequences while all other columns of the array are disabled (301). For some embodiments, the selected column may be enabled and all other columns disabled during column test sequences by causing global mask circuit 130 to select a block mask pattern that masks all bits of a search key except for the bit corresponding to the selected column. For example, to enable the first column and to disable all other columns, global mask circuit 130 may use a first block mask BMn="1000 . . . 00" to mask all but the first bit of the search key, for example, so that the first bit of the search key is driven onto the comparand line pair of the first column while the comparand line pairs of all other columns are driven to the same logic state (e.g., logic low). In this manner, only CAM cells in the selected column are enabled to participate in (e.g., and thus affect the match results of) compare operations associated with the column test sequences.

Then, the test machine initiates test patterns designed to detect faults in one or more of the CAM cells in the selected column (302). The test machine issues a test compare instruction that causes CAM array 200 to compare the first test comparand word, as masked by the selected block mask, with the first test data (303).

Next, the expected match results (on TST_INF) are compared with the actual match results generated by the test compare operation to generate a value of bit_PF that indicates whether the one or more tested CAM cells in the selected column is defective (304). As mentioned above, for some embodiments, fault detection logic 212 includes circuitry that generates bit_PF in response to a comparison between the expected match results and the actual match results. The results of the test compare operation may be read out from test circuit 180 and stored in a suitable storage element (not shown for simplicity) so that the test results for the first CAM cell in the selected column may be subsequently used to construct a fault signature for CAM array 200.

Then, the test machine may issue one or more additional test patterns to test the CAM cells in the selected column (305). Another test compare instruction is issued (306), and the expected match results are compared with the actual match results generated by the test compare operation to generate a value of bit_PF (307).

The operation described above with respect to 301-307 may then be repeated any number of times sufficient to test the desired number of CAM cells in the selected column (308). Each time a defect is detected in the selected column (e.g., as indicated by an asserted bit_PF signal), count logic 214 increments a defect count value (DCV) and compares the DCV with a maximum defect value (MDV). If DCV is equal to (or greater than) MDV, as tested in 309, count logic 214 freezes the current value of DCV and asserts COL_PF (e.g., to logic high) to designate the column as a bad column (310). Otherwise, if DCV remains less than (or equal to) MDV, count logic 214 maintains COL_PF in a de-asserted state (e.g., logic low) to designate the column as a good column (311). Thereafter, count logic 214 writes the value of COL_PF into the status latch 220 of the selected column (312).

It is to be noted that the particular process described above with respect to FIG. 3A is exemplary, and thus may be altered without departing from the scope of the present invention. For one example, the test data may be written to the CAM array before the block mask is used to enable the selected column and disable all other columns.

Figure 3B:
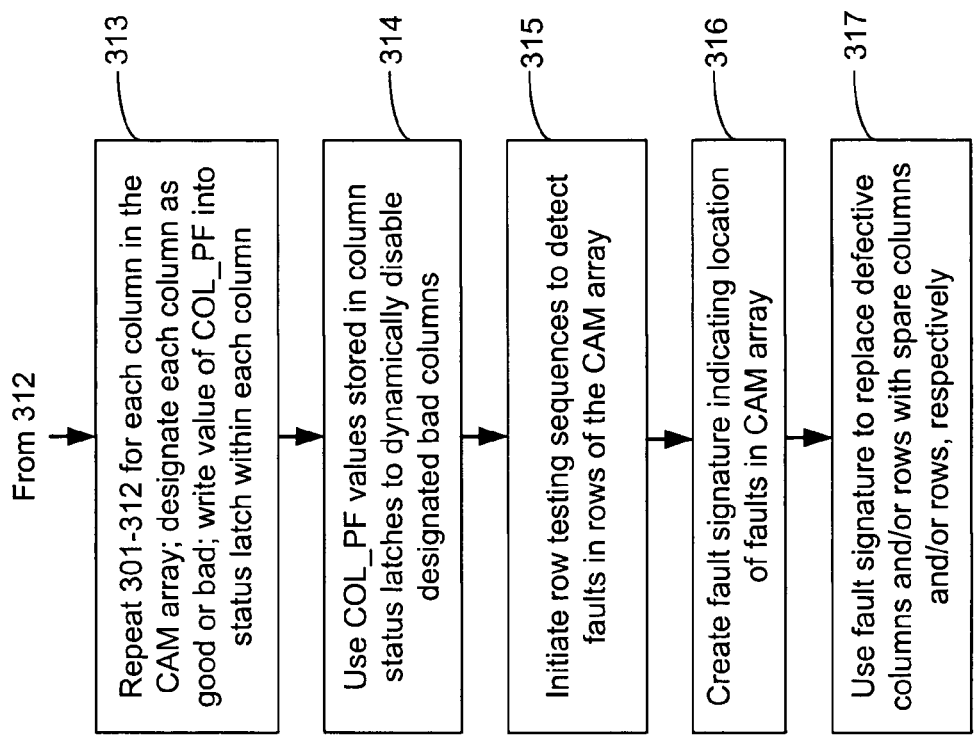

Referring now to FIG. 3B, the operation described above with respect to FIG. 3A may be repeated for each column in the CAM array so that the status latch 220 within each column of the CAM array stores a value of COL_PF that indicates whether the column is designated as a good column or as a bad column (313). For example, another column (e.g., the next adjacent column or next addressable column) is selected or enabled for the column test sequences while all other columns of the array are disabled (313) and the process repeats. For some embodiments, the next selected column may be enabled and all other columns disabled by causing global mask circuit 130 to increment the block mask pattern that masks all bits of a search key except for the bit corresponding to the selected column. For example, to enable the second column and to disable all other columns, global mask circuit 130 may use a second block mask BMn="0100 . . . 00" to mask all but the second bit of the search key, for example, so that the second bit of the search key is driven onto the comparand line pair of the first column while the comparand line pairs of all other columns are driven to the same logic state (e.g., logic low). In this manner, only CAM cells in the selected column are enabled to participate in (e.g., and thus affect the match results of) compare operations associated with the column test sequences.

Then, prior to row test sequences, the COL_PF values stored in latches 220 of CAM array 200 may be used to dynamically disable those columns designated as bad columns without disconnecting device 100 from the external test machine so that defects in the bad columns do not mask row defects in the CAM array during subsequent row test sequences (314).

More specifically, the COL_PF signals stored in column status latches 220 of the CAM array may be used to selectively force various bits of the block mask pattern employed during subsequent row test sequences to a masked state (e.g., to logic "0") to prevent the CAM cells in columns designated as bad columns from participating in (e.g., and thus affecting the results of) test compare operations associated with the row test sequence. For example, if the status latch 220 in the first column of the CAM array 200 stores an asserted COL_PF signal (i.e., indicating that the first column contains a predetermined number of defects), the asserted COL_PF signal causes global mask circuit 130 to force the corresponding bit (i.e., the first bit) of the block mask used for subsequent row test sequences to logic "0," which as described above forces the comparand line pair CL/$\overline{CL}$ of the first column to the same logical state so that CAM cells in the first column do not participate in compare operations associated with subsequent row test sequences. In this manner, embodiments of the present invention may prevent column defects from masking row defects during row test sequences. This may obviate having to remove the device from the external test machine, take the device to a repair station to physically disable the bad columns, and then return the device to the external test machine to perform the row test sequences, thus reducing test time and manufacturing costs.

Thus, with the designated bad columns of CAM array 200 dynamically disabled in response to the COL_PF signals stored in column status latches 220, the external test machine may initiate a series of row test sequences designed to detect defects in the rows of the CAM array using well-known testing techniques (315). After the rows of CAM array 200 are tested for defects, information indicating the location of defects in the CAM array may be analyzed using well-known techniques to create a fault signature (316), which in turn may be used to determine which columns and/or rows of the CAM array should be replaced by corresponding spare columns and/or spare rows, respectively, to optimize storage capacity and performance of the CAM array (317). For example, the device may be removed from the test machine, and taken to a repair station to replace the defective columns and/or rows with corresponding spare columns and/or rows, respectively, in a well-known manner. Thereafter, the wafer may be diced, and the individual dice may be packaged in a well-known manner. Alternatively, the device may be further tested and the fault signature used in conjunction with the additional test results to determine how best to utilized the available spare row and spare columns resources.

Figure 4:
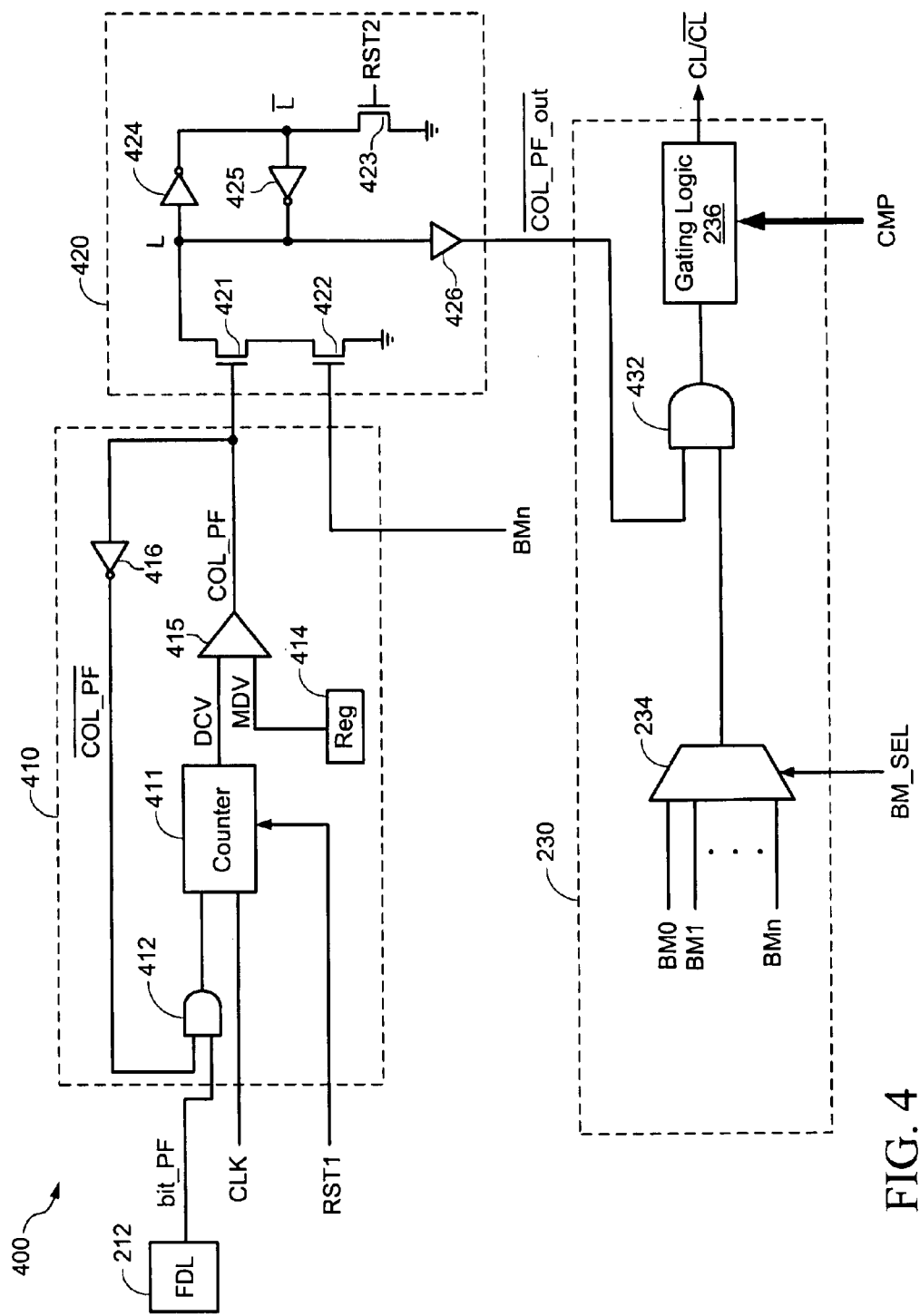
FIG. 4 is a block diagram of one embodiment of the test circuit of FIG. 2A.

FIG. 4 shows a simplified functional block diagram of a test circuit 400 for some embodiments of the present invention. Test circuit 400 includes fault detection logic 212 and count logic 410. Count logic 410, which is one embodiment of count logic 214 of FIG. 2A, includes a counter 411, an AND gate 412, a register 414, a comparator 415, and an inverter 416. Counter 411 includes a first input to receive a clock signal CLK, a second input to receive bit_PF from fault detection logic 212 via AND gate 412, an output coupled to a first input of comparator 415, and a control terminal to receive a reset signal RST1. Register 414, which may be any suitable storage element, stores MDV. Comparator 415 generates COL_PF in response to a comparison between DCV and MDV. For some embodiments, comparator 415 asserts COL_PF (e.g., to logic high) if DCV is equal to MDV, and de-asserts COL_PF (e.g., to logic low) if DCV is less than MDV. The value of COL_PF is logically inverted by inverter 416 and provided as $\overline{COL\_PF}$ to AND gate 412. RST1 resets the counter value each time a new column is selected for testing.

Count logic 410 is coupled to a column status latch 420, which stores column status information (e.g., COL_PF and/or its logical complement) for a corresponding column of the CAM array. For simplicity, FIG. 4 shows count logic 410 coupled to only one column status latch 420. However, for actual embodiments, count logic 410 is coupled to a plurality of column status latches 420 each for storing a COL_PF signal for a corresponding column of the CAM array. Column latch 420, which is one embodiment of latch 220 of FIG. 2A, includes NMOS transistor 421, NMOS transistors 422-423, inverters 424-425, and a buffer 426. Inverters 424-425 form a bi-stable latch having a data node L and a complementary data node $\overline{L}$, where node L stores the value of $\overline{COL\_PF}$ and node $\overline{L}$ stores COL_PF. Transistors 421-422 are connected in series between node L and ground potential, with the gate of NMOS transistor receiving COL_PF from count logic 410 and the gate of NMOS transistor 422 receiving a corresponding bit of BMn. NMOS pull-down transistor 423 is connected between node $\overline{L}$ and ground potential, and includes a gate to receive RST2, which is used to reset latch 420 to a know state (e.g., prior to testing or at device power up). The column status signal may be read from status latch 220 as $\overline{COL\_PF\_out}$ via buffer 426, which may be omitted. Note that alternative embodiments of a latch implementation may be used.

As depicted in FIG. 4, column status latch 420 is coupled to global mask circuit 230 (see also FIG. 2B). For purposes of discussion herein, global mask circuit 230 is shown to include an AND gate 432 having a first input coupled to the output of MUX 234, a second input to receive $\overline{COL\_PF\_out}$ from status latch 420, and an output coupled to a corresponding input of gating logic 236. For actual embodiments, the logical function(s) performed by AND gate 432 may be implemented using existing circuitry provided within gating logic 236.

An exemplary operation of test circuit 400 of FIG. 4 is as follows. Initially, RST1 is asserted (e.g., to logic high), which causes counter 411 to reset DCV to zero, and RST2 is asserted to a logic high state, which in turn drives node L to a logic high state. During column testing, the corresponding bit of BMn turns on NMOS transistor 422 of latch 220 so that the value of COL_PF may be written to latch 420 by count logic 410. Fault detection logic 212 asserts bit_PF to logic high each time a defect is detected, as described above with respect to FIG. 3A. Counter 411 increments DCV each time bit_PF is asserted. Comparator 415 compares DCV with MDV, and maintains COL_PF in a logic low state as long as DCV<MDV. So long as COL_PF is in a logic low state, node L will remain in a logic high state to indicate that the column is a good column. The resulting logic high state of $\overline{COL\_PF\_out}$ is provided to AND gate 432 by buffer 426 and causes AND gate 432 to pass (e.g., unaltered) the corresponding bit of the block mask to gating logic 236. After the column testing is complete, and during subsequent row test sequences, gating logic 236 logically combines CMP with the block mask to drive a desired masked search key onto comparand line pairs CL/$\overline{CL}$ of the CAM array.

Conversely, if DCV=MDV, then comparator 415 drives COL_PF to logic high to indicate that the selected column is designated as a bad column. The logic high state of COL_PF is logically inverted by inverter 416 to force $\overline{COL\_PF}$ to logic low, which forces the output of AND gate 412 to logic low, thereby freezing the current value of DCV. The logic high state of COL_PF also turns on NMOS transistor 421, which together with NMOS transistor 422, pulls node L low toward ground potential. The resulting logic low state of $\overline{COL\_PF\_out}$ is provided via buffer 426 to AND gate 432, which in response thereto forces the corresponding bit of the block mask to logic low. In response thereto, gating logic 236 drives the comparand line pair CL/$\overline{CL}$ corresponding to column status latch 420 to the same logic state so that during subsequent row test sequences the designated bad column does not participate in generating match results, and thus does not mask row defects in the CAM array.

As mentioned above, the CAM cells in CAM array 200 may be any suitable type of CAM cell including, for example, binary CAM cells, ternary CAMs, and/or quaternary CAM cells. For some embodiments, CAM cells 202 of CAM array 200 may be quaternary CAM cells 500 of FIG. 5. Quaternary CAM cell 500 includes a first storage cell 510 that stores a first bit X, a second storage cell 520 that stores a second bit Y, and a compare circuit 530. Storage cells 510 and 520 can be any suitable storage element including, for example, a Static Random Access Memory (SRAM) cell, a Dynamic RAM (DRAM) cell, and the like. Storage cell 510 includes a data output to provide X data to a first bit line BLX via NMOS pass transistor 511, and includes a complementary data output to provide $\overline{X}$ to a first complementary bit line $\overline{BLX}$ via NMOS pass transistor 512. Storage cell 520 includes a data output to provide Y data to a second bit line BLY via NMOS pass transistor 521, and includes a complementary data output to provide $\overline{Y}$ to a second complementary bit line $\overline{BLY}$ via NMOS pass transistor 522. The gates of pass transistors 511-512 and 521-522 are coupled to word line WL.

Compare circuit 530 includes NMOS transistor pairs 531-532 and 535-534 each connected in series between match line ML and ground potential. For some embodiments, match line ML is pre-charged (e.g., toward $V_{DD}$) for compare operations by a well-known pre-charge circuit (not shown). The gate of transistor 533 is responsive to a comparand bit C provided on a comparand line CL, the gate of transistor 534 is responsive to Y, the gate of transistor 531 is responsive to a complementary comparand bit $\overline{C}$ provided on a complementary comparand line $\overline{CL}$, and the gate of transistor 532 is responsive to X.

The X and Y bits are written to and read from cells 510 and 520, respectively, using read/write circuit 140 in a well-known manner. The X and Y bits can each be either logic high (i.e., a "1") or logic low (i.e., "0"), and collectively represent four possible logic states for a data bit stored by CAM cell 500. For one embodiment, the four logic states of the data state as represented by X and Y are summarized in Table 1 below.

TABLE 1

| X | Y | Data State |
|---|---|---|
| 0 | 0 | always match |
| 0 | 1 | 0 |
| 1 | 0 | 1 |
| 1 | 1 | always mismatch |

For data states 0 and 1, if the comparand data matches the data stored in CAM cell 500, compare circuit 530 does not discharge ML, which indicates the match condition. Conversely, if the comparand data does not match the data stored in CAM cell 500, compare circuit 530 discharges ML (e.g., toward ground potential) to indicate the mismatch condition. For the "always match" state, the logic low values for X and Y maintain respective transistors 532 and 534 in non-conductive states, thereby preventing compare circuit 530 from discharging ML. In this manner, data stored in CAM cell 500 is masked from the compare operation, thereby forcing a match condition for CAM cell 500, regardless of the comparand data. In this state, the cells 510 and 520 effectively store a don't care state. For the "always mismatch" state, the logic high values for X and Y maintain respective transistors 532 and 534 in conductive states. During a compare operation, at least one of C or $\overline{C}$ will be logic high, and compare circuit 530 discharges ML to indicate the mismatch state.

Figure 5:
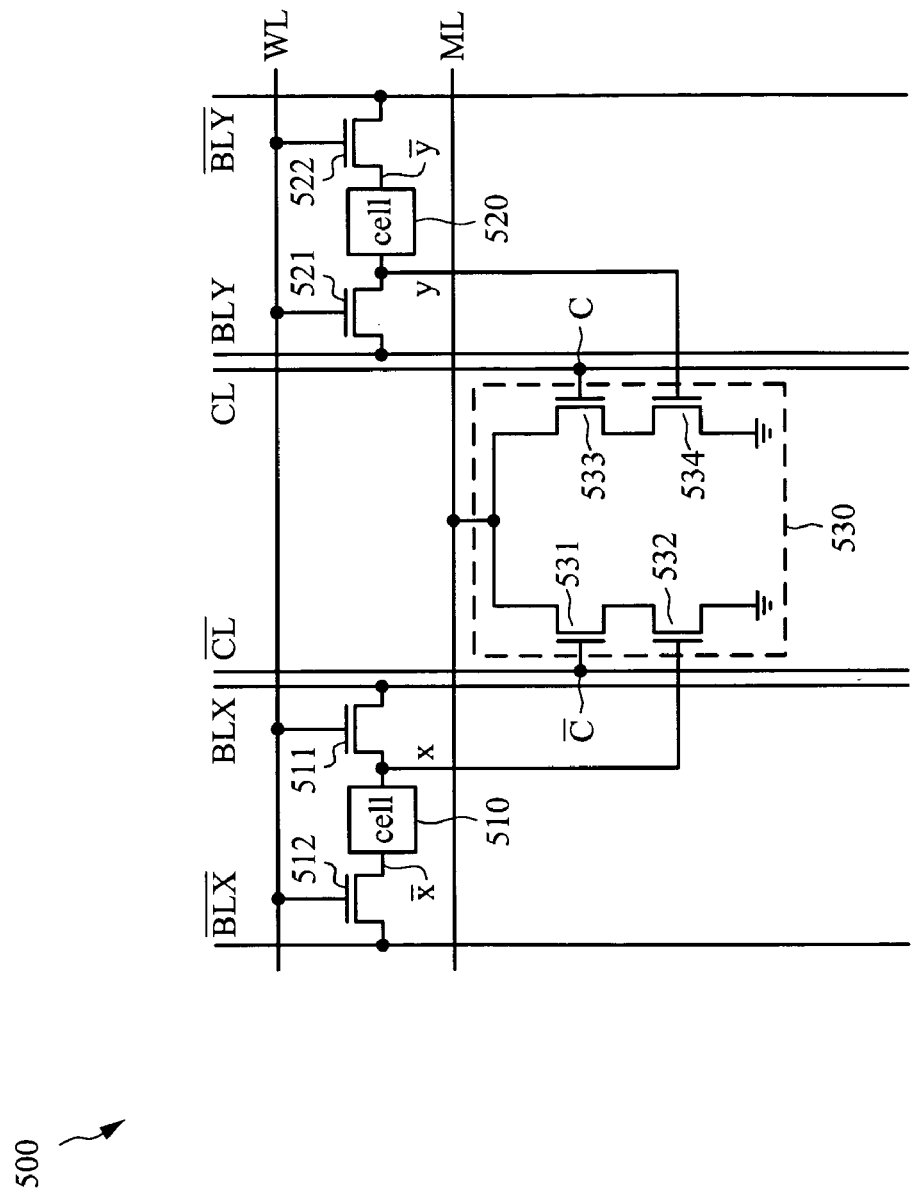
FIG. 5 is a block diagram of another embodiment of the CAM cells of FIG. 2A.

For some embodiments of device 100 in which CAM cells 202 of CAM array 100 are quaternary CAM cells 500 of FIG. 5, spare rows 116 may be programmed to replace defective rows of CAM cells in main CAM array 112 in a manner similar to that described in commonly owned U.S. Pat. No. 6,865,098, the entirety of which is incorporated by reference herein.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention.

What is claimed is:

1. A content addressable memory (CAM) device, comprising:
   a CAM array having a plurality of columns of CAM cells;
   a plurality of storage elements, each for storing a column pass/fail signal indicating whether a corresponding column of CAM cells is designated as good or as bad; and
   a test circuit having an output coupled to the storage elements, and configured to generate the column pass/fail signals during a column test sequence, wherein the test circuit further comprises:
   a first input to receive test match results from the array; and
   a second input to receive expected match results.

2. The CAM device of claim 1, wherein during the column test sequence, test data is written to the CAM array and a series of compare operations between the test data and corresponding test comparand words generates the test match results.

3. The CAM device of claim 1, wherein the test circuit is configured to write the column pass/fail signals into corresponding storage elements.

4. The CAM device of claim 1, wherein the test circuit asserts each column pass/fail signal if the corresponding column has at least a predetermined number of defects.

5. The CAM device of claim 1, wherein during a subsequent row test sequence, the column pass/fail signals stored in the storage elements selectively prevent corresponding columns of CAM cells from participating in test compare operations associated with the row test sequence.

6. The CAM device of claim 1, wherein each column of CAM cells is coupled to a corresponding comparand line pair, the device further comprising:
   means for selectively driving each comparand line pair to the same logic state in response to the corresponding column pass/fail signal during test compare operations associated with a subsequent row test sequence.

7. A content addressable memory (CAM) device, comprising:
   a CAM array having a plurality of columns of CAM cells;
   a plurality of storage elements, each for storing a column pass/fail signal indicating whether a corresponding column of CAM cells is designated as good or as bad;
   a test circuit having an output coupled to the storage elements, and configured to generate the column pass/fail signals during a column test sequence; and
   a global mask circuit having inputs coupled to the storage elements and having outputs coupled to the columns of CAM cells.

8. The CAM device of claim 7, wherein the global mask circuit is configured to select one of a plurality of block masks for selectively masking the columns of CAM cells during compare operations associated with the column test sequence.

9. The CAM device of claim 8, wherein during compare operations associated with a subsequent row test sequence, an asserted column pass/fail forces a corresponding bit in the selected block mask to a masked state to prevent the corresponding column from participating in the compare operations.

10. The CAM device of claim 7, wherein the test circuit comprises:
    fault detection logic having an input to receive match results from the CAM array, and having an output to generate a bit pass/fail signal; and
    count logic having an input to receive the bit pass/fail signal and having an output to generate the column pass/fail signals.

11. The CAM device of claim 10, wherein during the column test sequence, the fault detection logic asserts the bit pass/fail signal each time a defect is detected in a selected column.

12. The CAM device of claim 11, wherein during the column test sequence, the fault detection logic compares the match results from the CAM array with expected match results to generate the bit pass/fail signal.

13. The CAM device of claim 11, wherein during the column test sequence, the count logic increments a defect count value in response to each assertion of the bit pass/fail signal, and selectively asserts the column pass/fail signal in response to a comparison between the defect count value and a predetermined number.

14. The CAM device of claim 13, wherein the column pass/fail signals are stored in the corresponding storage elements.

15. A method of detecting defects in a content addressable memory (CAM) device having a plurality of columns and rows of CAM cells and connected to an external test machine, the method comprising:
  selecting one of the columns of CAM cells;
  testing the selected column for defects during a column test sequence;
  designating the selected column as either good or bad in response to the testing; and
  selectively disabling the selected column in response to the designating without disconnecting the device from the test machine, wherein the designating comprises:
  counting a number of defects detected in the selected column by the testing;
  comparing the number of defects with a predetermined number; and
  asserting a column pass/fail signal to designate the column as bad if the number of defects exceeds the predetermined number.

16. The method of claim 15, wherein the selectively disabling comprises:
  writing the asserted column pass/fail signal into a storage element corresponding to the selected column.

17. The method of claim 16, wherein the selectively disabling further comprises:
  selectively forcing one or more bits of a block mask to masked states in response to the column pass/fail signals, wherein the block mask prevents columns designated as bad from participating in compare operations associated with a subsequent row test sequence.

18. The method of claim 15, further comprising:
  testing the rows of CAM cells during a subsequent row test sequence, wherein the disabled columns are prevented from participating in compare operations associated with the row test sequence.

19. A method of detecting defects in a content addressable memory (CAM) device having a plurality of columns and rows of CAM cells and connected to an external test machine, the method comprising:
  selecting one of the columns of CAM cells;
  testing the selected column for defects during a column test sequence;
  designating the selected column as either good or bad in response to the testing; and
  selectively disabling the selected column in response to the designating without disconnecting the device from the test machine, wherein the testing comprises:
  generating test match results in response to one or more comparisons between test data stored in the CAM array and one or more test comparand words;
  comparing the generated test match results with expected match results; and
  asserting a bit pass/fail signal each time a defect is detected in the comparing.

20. A method of detecting defects in a content addressable memory (CAM) device having a plurality of columns and rows of CAM cells and connected to an external test machine, the method comprising:
  testing each column of CAM cells for defects during a column test sequence;
  designating each column as either good or bad in response to the testing, wherein the designating comprises:
    for each column of CAM cells, generating a column pass/fail signal indicating whether the column is bad; and
    storing each column pass/fail signal in a storage element for the corresponding column of CAM cells;
  testing the rows of CAM cells for defects during a row test sequence; and
  preventing columns designated as bad from participating in compare operations associated with the row test sequence without disconnecting the device from the test machine, wherein the preventing comprises:
  for each column designated as bad, driving a comparand line pair of the column to the same logic state during the compare operations associated with the row test sequence.

21. The CAM device of claim 20, wherein the designating is performed using a test circuit provided within the CAM device.

22. A method of detecting defects in a content addressable memory (CAM) device having a plurality of columns and rows of CAM cells and connected to an external test machine, the method comprising:
  testing each column of CAM cells for defects during a column test sequence;
  designating each column as either good or bad in response to the testing, wherein the designating comprises:
    for each column of CAM cells, generating a column pass/fail signal indicating whether the column is bad; and
    storing each column pass/fail signal in a storage element for the corresponding column of CAM cells;
  testing the rows of CAM cells for defects during a row test sequence; and
  preventing columns designated as bad from participating in compare operations associated with the row test sequence without disconnecting the device from the test machine, wherein the preventing comprises:
  selectively forcing one or more bits of a block mask to masked states in response to the column pass/fail signals, wherein the block mask prevents columns designated as bad from participating in the compare operations associated with the row test sequence.

23. A method of detecting defects in a content addressable memory (CAM) device having a plurality of columns and rows of CAM cells and connected to an external test machine, the method comprising:
  selecting one of the columns of CAM cells for a column test sequence;
  generating test match results in response to one or more comparisons between test data stored in the CAM array and one or more test vectors;
  comparing the generated test results with expected test results;
  asserting a bit pass/fail signal each time a defect is detected in the comparing;
  incrementing a defect count value each time the bit pass/fail signal is asserted;
  comparing the defect count value with a predetermined value;
  asserting a column pass/fail signal if the defect count value exceeds a predetermined value;
  storing the asserted column pass/fail signal in a storage element corresponding to the selected column; and
  dynamically disabling the selected column during subsequent row test sequences in response to the asserted column pass/fail signal.

24. The CAM device of claim 18, wherein the designating is performed using a test circuit provided within the CAM device.

* * * * *